US 6,580,657 B2

(12) United States Patent
Sanford et al.

(10) Patent No.: US 6,580,657 B2
(45) Date of Patent: Jun. 17, 2003

(54) LOW-POWER ORGANIC LIGHT EMITTING DIODE PIXEL CIRCUIT

(75) Inventors: James Lawrence Sanford, Hopewell Junction, NY (US); Eugene S. Schlig, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/754,489

(22) Filed: Jan. 4, 2001

(65) Prior Publication Data

US 2002/0084463 A1 Jul. 4, 2002

(51) Int. Cl.⁷ ................................................ G11C 8/00
(52) U.S. Cl. .................... 365/230.05; 365/154; 257/59; 257/88; 257/93; 257/82
(58) Field of Search .............................. 257/59, 88, 93; 345/76, 82; 315/169.3, 169.1

(56) References Cited

U.S. PATENT DOCUMENTS

| | | | | |
|---|---|---|---|---|
| 5,151,632 A | * | 9/1992 | Troxell | 315/169.1 |
| 5,353,251 A | * | 10/1994 | Uratani et al. | 365/154 |
| 5,471,225 A | * | 11/1995 | Parks | 345/205 |
| 5,682,174 A | * | 10/1997 | Chiu | 345/211 |
| 5,689,471 A | * | 11/1997 | Voss et al. | 365/156 |
| 5,712,652 A | * | 1/1998 | Sato et al. | 345/204 |
| 5,723,950 A | * | 3/1998 | Wei et al. | 315/169.3 |
| 5,903,246 A | | 5/1999 | Dingwall | 345/82 |
| 5,952,789 A | | 9/1999 | Stewart et al. | 315/169.4 |
| 6,023,259 A | | 2/2000 | Howard et al. | 345/76 |
| 6,072,517 A | * | 6/2000 | Fork et al. | 347/237 |
| 6,229,508 B1 | * | 5/2001 | Kane | 345/82 |
| 6,310,600 B1 | * | 10/2001 | Koyama et al. | 345/103 |
| 6,339,417 B1 | * | 1/2002 | Quanrud | 345/55 |
| 6,351,077 B1 | * | 2/2002 | Koyama | 315/169.3 |
| 6,459,611 B2 | * | 10/2002 | Rimondi | 365/156 |
| 2002/0030647 A1 | * | 3/2002 | Hack et al. | 345/82 |

FOREIGN PATENT DOCUMENTS

| | | |
|---|---|---|
| EP | 1 005 013 A1 | 5/2000 |
| WO | WO 99/38148 | 7/1999 |
| WO | WO 99/42983 | 8/1999 |

OTHER PUBLICATIONS

"FA 16.5: A 16Mb CMOS SRAM with a $2.3\mu^2$ Single–Bit–Line Memory Cell," Sasaki et al, pp. 250–251, 1993 IEEE Internaitonal Solid–State Circuits Conference. (Month unknown).

"Low–Power SRAM Circuit Design," Martin Margala, 1999 IEEE, pp. 115–122. (Aug.).

"FA 16.6: A Single Bitline Cross–Point Cell Activation (SCPA) Architecture for Ultra Low Power SRAMs," Ukita et al., 1993 IEE Internaitonal Solid–State Circuits Conference, pp. 252–253.

"Active Matrix Molecular OLED Microdisplays," Olivier Prache, 14 pages, date unknown.

(List continued on next page.)

Primary Examiner—David Nelms
Assistant Examiner—Tu-Tu Ho
(74) Attorney, Agent, or Firm—Ohlandt, Greeley, Ruggiero & Perle, L.L.P.; Robert M. Trepp

(57) ABSTRACT

A pixel circuit comprises an organic light emitting diode (OLED), and a static memory for storing data that represents an operational state of the OLED. In alternative embodiments, a pixel circuit may include a complementary metal oxide semiconductor (CMOS) circuit for controlling the OLED, a protection circuit for protecting the CMOS circuit from an over-voltage condition, and a current source with a field effect transistor (FET) having a static gate to source voltage that is greater than a threshold voltage of the FET.

26 Claims, 8 Drawing Sheets

OTHER PUBLICATIONS

"OL12C10M—Preliminary Data Sheet," eMagin OLED Microdisplay, 2 pages, date unknown.

"Current–Writing Active–Matrix Circuit for Organic Light–Emitting Diode Display Using a–Si:H Thin–Film–Transistors," Reiji Hattori, IEICE Trans. Elelctron., vol. E83–C, No. 5, May 2000.

"Polysilicon VGA Active Matrix OLED Displays—Technology and Performace," Stewart et al., IEDM 1998, pp. 871–874. (Sep.).

"VGA Active Matrix OLED Displays having the single polysilicon TFT Pixel Structure," Hatalis et al., Proceedings of SPIE, v. 3636, Jan. 27–29, 1999, pp. 22–31.

"Sony Develops World's Largest Full Color Organic EL Display," Sony News Press Release, Feb. 7, 2001, three pages.

"36.1: 6–Bit Digital VGA OLED," Mizukami et al., SID 00 Digest, pp. 912–915. (? 2000).

"36.4L: Late–News Paper: 4.0–in. TFT–OLED Displays and a Novel Digital Driving Method," Inukai et al., SID 00 Digest, pp. 924–927. (? 2000).

"4.2: Design of an Improved Pixel for a Polysilison Active–Matrix Organic LED Display," Dawson et al., SID 98 Digest, pp. 11–14.

"31.3: A Poly–Si Active–Matrix OLED Display with Integrated Drivers," Dawson et al., SID 99 Digest, pp. 438–441. (Months unknown).

Sasaki et al., "*A 16Mb CMOS SRAM with a 2.3μm² Single–Bit–Line Memory Cell*", IEEE International Solid–State Circuits Conference (1993), p. 250–251.

\* cited by examiner

LOW-POWER ORGANIC LIGHT EMITTING DIODE PIXEL CIRCUIT

FIELD OF THE INVENTION

This invention relates generally to a pixel circuit, and, more particularly, to a low-power organic light emitting diode (OLED) pixel circuit utilizing complementary metal oxide semiconductor (CMOS) technology.

BACKGROUND OF THE INVENTION

An OLED pixel may utilize any of a variety of organic materials that emit light when an electric current is applied thereto. An OLED display comprises a plurality of OLED pixels organized into an array.

Illumination of an OLED pixel is controlled by a pixel circuit that may include either a constant current source or a constant voltage source. It is generally recognized that the constant current source provides a greater uniformity of luminance among the pixels of the array. This is because the dependence of luminance upon current tends to be uniform while the voltage across the OLEDs at a given current in the various pixels tends to be less uniform. U.S. Pat. No. 6,023,259 to Howard et al. describes a current driver that provides a passive matrix drive current to an OLED. For typical display brightness, passive matrix drive operation results in lower OLED power efficiency and, in order to avoid flicker, requires a refresh rate greater than or equal to 60 Hz.

In an active matrix display, a provision is generally made for storage of the state of a pixel within its respective pixel circuit. This is commonly achieved by incorporating the equivalent of a dynamic RAM cell in each pixel circuit, in which the state is stored as a voltage across a capacitor. A disadvantage of such an arrangement is that the voltage quickly bleeds off the capacitors, and consequently any image represented on the display must be regularly refreshed. This act of refreshing the image consumes a significant quantity of power. It is therefore desirable to find an alternative to the conventional use of dynamic RAMs.

Control of the luminance of an "on" pixel is commonly achieved by controlling a magnitude of an analog voltage that determines the voltage or current applied to the pixel. Analog control circuits are another source of excessive power dissipation. It is therefore desirable to find an alternative to the conventional use of analog control circuitry.

The OLED display is constructed of thin layers of organic material in which individual OLED pixels are subject to an occasional short circuit between an anode of the OLED and a counter-electrode of the OLED. Such a short can cause excess current to flow in the circuit, excess voltage across the pixel circuit and excess power dissipation. Good pixels neighboring a shorted pixel may be destroyed by heat from the shorted pixel and the excess current may alter power supply voltages.

During operation of the OLED display, the layers of organic material tend to trap charge, causing increases in the voltage drop across the OLED, which can cause a non-uniformity of luminance and a burned-in image. The trapped charge may be removed by reverse-biasing the OLED.

The OLED itself typically requires a voltage on the order of +/−6 volts to develop an adequate luminance when turned ON and to remove trapped charge when reverse-biased. Conventional CMOS integrated circuit technology uses transistors that operate with a voltage of less than 4 volts. Accordingly, CMOS technology is not ordinarily capable of driving an OLED. Furthermore, a CMOS device in an OLED pixel circuit is particularly susceptible to damage from the voltage in excess of 4 volts.

A traditional manner of changing a displayed image is for a processor to update the memory of a display controller that periodically and individually addresses each of the pixels of the display, and turn them "on" (ON) and "off" (OFF) as required. If the display included a large number of pixels, for example one hundred thousand, one million, or more, this operation would consume a significant quantity of power and could burden the processor.

An additional problem when incorporating a plurality of pixel circuits into a display is that of physically distributing the collective elements of the display. That is, the display is a finite area within which the pixels and their accompanying circuitry are confined, yet a constant pitch between pixels must be maintained in order to provide a uniform image.

Because of the aforementioned disadvantages, OLED displays have not been as readily adopted by designers as have many other conventional display technologies. The use of dynamic RAM and its corresponding circuitry required for refreshing an image, and issues relating to power dissipation are an obstacle to an employment of OLEDs in battery operated devices, and in small displays such as those used for hand-held devices or watches. The OLED operating voltages are an obstacle to the use of CMOS circuitry in an OLED pixel circuit. The regular addressing of every pixel in an array is an obstacle to the employment of OLEDs in large displays. The maintenance of a constant pitch between pixels is an important consideration in any display.

OBJECTS OF THE INVENTION

It is an object of this invention to provide an improved OLED display that overcomes the foregoing and other problems.

It is a further object of the present invention to provide an improved OLED pixel circuit that dissipates low power, and is therefore suitable for use in a small battery powered device.

It is another object of the present invention to provide such an OLED pixel circuit in which a state of the pixel is retained in a static storage cell or memory while maintaining high circuit density and low power.

It is another object of the present invention to provide an OLED pixel circuit that utilizes CMOS technology for controlling an OLED.

It is another object of the present invention to provide an OLED pixel circuit that confines an effect of a short-circuited pixel so that non-shorted pixels continue operating in a normal manner.

It is yet another object of the present invention to provide an OLED pixel circuit that is capable of handling a large voltage variation across the OLED between normal and reverse-biased states without subjecting the OLED pixel circuit transistors to an excess voltage.

It is a further object of the present invention to provide an OLED pixel circuit that is suitable for use in a large display format.

SUMMARY OF THE INVENTION

In accordance with a first embodiment of this invention, a pixel circuit includes an organic light emitting diode (OLED), and a static memory for storing data that represents an operational state of the OLED.

In accordance with a second embodiment of this invention, a pixel circuit includes an OLED, a complementary metal oxide semiconductor (CMOS) circuit for controlling the OLED, and a protection circuit for protecting the CMOS circuit from over-voltage conditions.

In accordance with a third embodiment of this invention, a pixel circuit includes an OLED, and a CMOS circuit for controlling the OLED. The CMOS circuit contains a current source constructed using a field effect transistor (FET) having a static gate to source voltage that is greater than a threshold voltage of the FET.

In accordance with a fourth embodiment of this invention a display includes an array of pixel circuits. Each of the pixel circuits contains an OLED, and a static memory for storing data that represents an operational state of the OLED.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

The teachings in accordance with presently preferred embodiments of this invention relate to active matrix OLED displays. Such displays may be configured as micro-displays and incorporated into small, battery-powered devices such as electronic wristwatches. This particular field of use and application should not, however, be construed in any manner as a limitation upon the practice of the teachings of this invention.

Figure 1A:
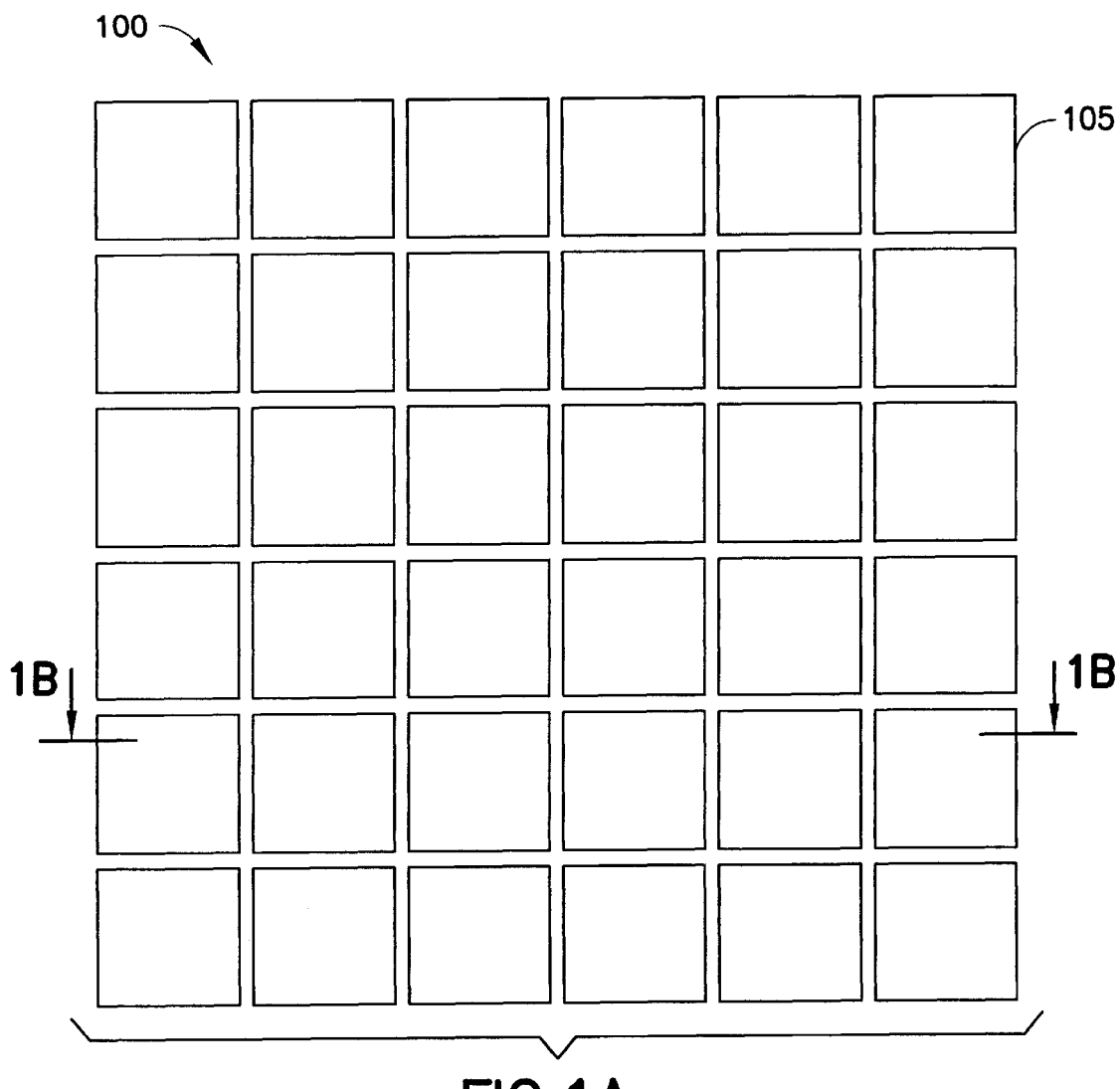
FIG. 1A is an illustration of a top view of an array of OLED structures, in accordance with the teachings of this invention.
Figure 1B:
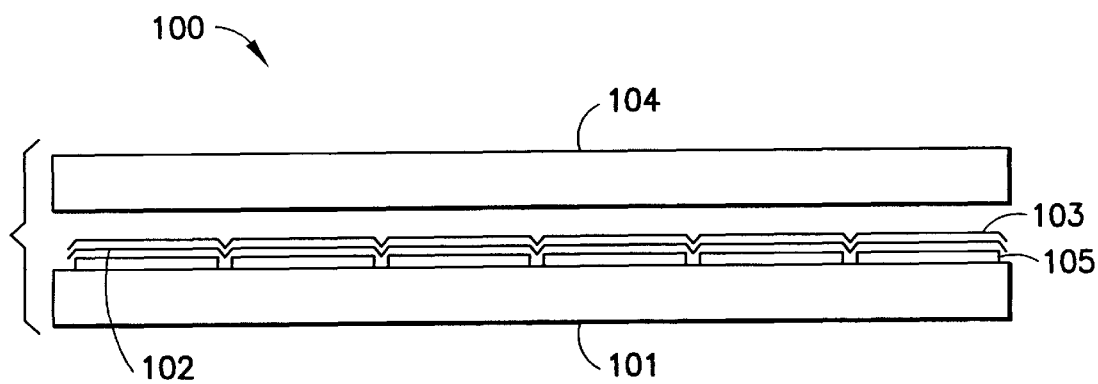
FIG. 1B is a side view of the array of FIG. 1A taken through line 1B—1B.

FIG. 1A is an illustration of a top view of an array 100 of OLED structures, e.g., picture elements (pixels) or light emitting elements, and FIG. 1B is a side view of array 100 taken through line 1B—1B of FIG. 1A. Each OLED structure of array 100 is constructed to have a pixel circuit that includes an OLED and a static memory for storing data that represents an operational state of the OLED.

Array 100 may be generally considered to be a regular n×m array of pixels, where n may or may not be equal to m.

Array 100 includes a plurality of OLED structures, each of which has an anode electrode 105. The anode electrodes 105 are arranged in two dimensions, forming a planar display. The side view shown in FIG. 1B depicts the vertical structure of array 100 on, by example, a silicon chip 101 upon which anode electrodes 105 are patterned. Disposed below anode electrodes 105 may be a light-blocking layer (not shown) to prevent OLED light or external light from reaching underlying circuitry. An organic layer 102 and a transparent cathode counter-electrode layer 103 are disposed above anode electrodes 105.

In some OLED displays with a transparent anode, an observer may view the OLED through its anode electrode 105, but the preferred embodiment involves viewing the OLED through its cathode counter-electrode layer 103. This is because the silicon substrate 101 is not transparent, but is opaque.

A protective cover glass 104 is attached to the silicon chip 101 over cathode electrode layer 103 to provide environmental protection for the OLED structure. A suitable getter for moisture absorption may also be positioned within a cover-glass-to-silicon seal, but outside the boundary of array 100.

In an active matrix scheme of addressing the display, data that defines a state of the pixels, that is, whether the pixel is ON, i.e., luminous, or OFF, i.e., dark, may be written to, and stored, in either a dynamic or static memory structure. The stored data may also be read out from the memory structure, if it is so configured, for example, for purposes of electrical testing. In a dynamic memory array, data is stored on a capacitor and must be refreshed periodically, an operation that dissipates power. In a static memory, data is stored in an electronic latch comprised of CMOS circuits, and virtually no power is dissipated to hold the data. The OLED display apparatus in accordance with the presently preferred embodiments of this invention uses static memory for low power dissipation.

In an active matrix display in accordance with these teachings the organic material is sandwiched between pixel electrodes of the underlying circuit and a counter-electrode. The pixel electrode is typically the anode of the light emitting diode and the counter-electrode is typically the cathode. The display is formed as a rectangular array of pixels that are turned ON or OFF as the displayed image requires. Each pixel has a pixel anode electrode and pixel circuits that control the electrical state of the anode relative to the counter-electrode.

The pixel circuits may be constructed using thin-films formed on an insulating substrate, or they may be constructed using integrated circuit technology, preferably silicon-based. In general, the pixel circuit can be fabricated with (1) any suitable material, such as, for example, crystalline silicon, amorphous silicon, polysilicon, micro crystalline silicon, an organic semiconductor or a polymer semiconductor, and (2) disposed, for example, on a substrate of silicon, glass, plastic, ceramic, or sapphire ($AL_2O_3$). The thin-film circuits on an insulating (dielectric) substrate have the advantages of lower cost and an ability to be fabricated into large displays. In general, the use of crystalline silicon devices is confined to small area arrays, but the circuits have higher performance and higher fabrication density than the thin-film circuits. The OLED circuitry in accordance with these teachings is suitable for being implemented using a variety of fabrication techniques, but the crystalline silicon technology is the preferred embodiment. Since silicon substrates are opaque to visible light, light emission is preferably through the counter-electrode, which is preferably formed as a continuous sheet of transparent conductive material such as indium tin oxide, e.g., see counter-electrode layer 103.

In the description that follows, the term "array" is used to refer to an array of pixels as well as to an array of anodes.

Figure 2:
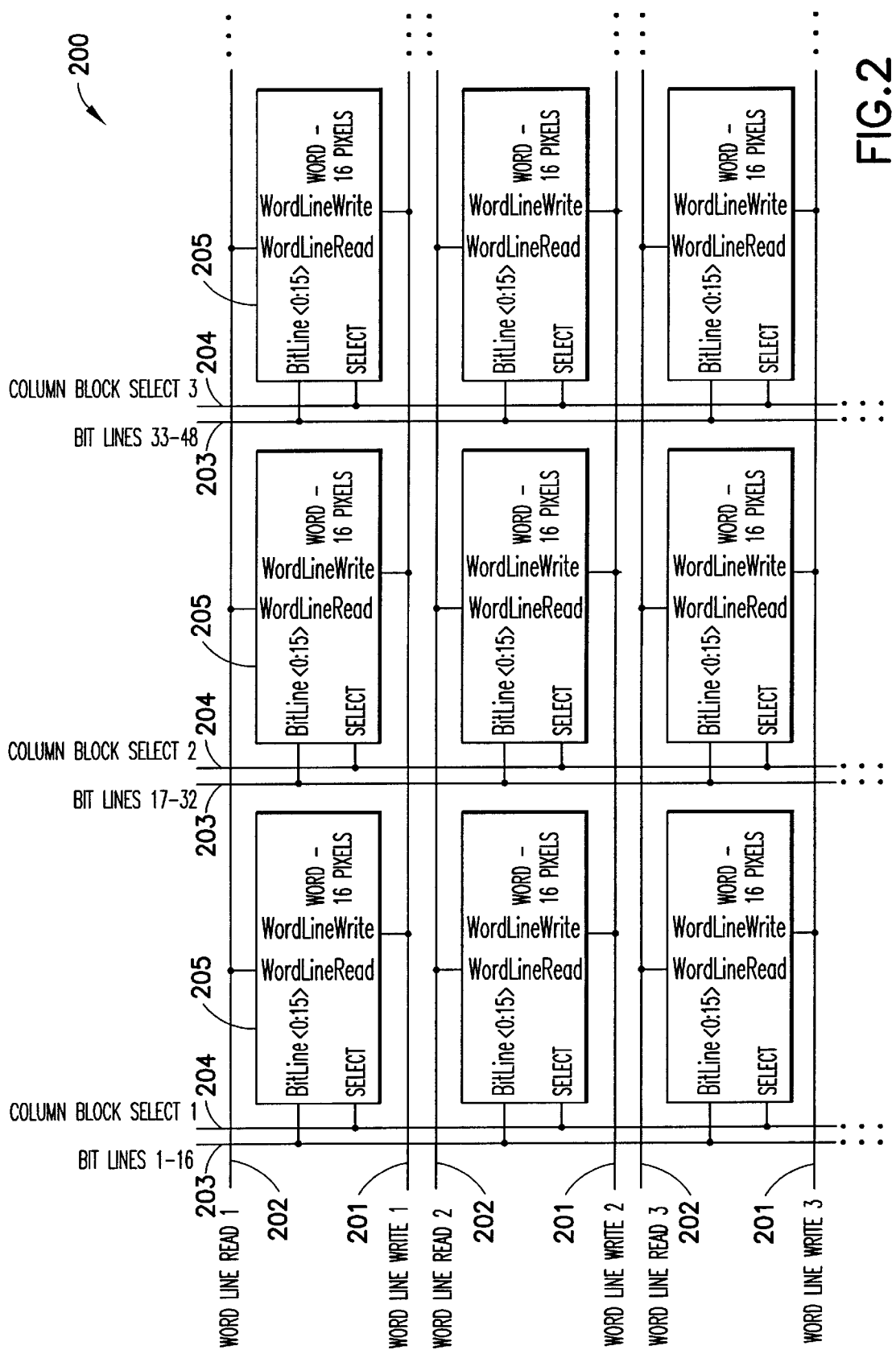
FIG. 2 is a block diagram of an OLED pixel word array structure, each word being composed of 16 pixels.

FIG. 2 is a block diagram of an OLED array 200 comprising a plurality of data storage devices or units, also referred to herein as word structures 205. Each word structure 205 is a static random access memory (SRAM) of, for example, 16 bits that correspond to sixteen pixels along a row of array 200. In this embodiment data is written into, and read out of, the array 16 bits at a time.

The inputs to each word structure 205 are a column block select 204, bit lines 203, a word line read 202 and a word line write 201. Data is written into word structure 205 from bit lines 203 when word line write 201 and column block select 204 lines are both activated, for example by switching them to a high state. Data is read from word structure 205 onto bit lines 203 when word line read 202 and column block select 204 are both activated. No operation is defined for the case where both word line read 202 and word line write 201 lines are active.

Note that each column block select 204 relates to a column of array 200, whereas each word line write 201 and word line read 202 relates to a row of array 200. By using an appropriate combination of column block selects 204, word line writes 201 and word line reads 202, data can be written to, or read from, any of word structures 205 in array 200.

The total number of bit lines 203 corresponds to the number of columns of pixels in array 200. Since each word structure 205 represents 16 pixels, the number of column block selects 204 corresponds to the number of columns of pixels in array 200 divided by 16.

Conventional SRAMs typically use complimentary bit lines, i.e., two lines per bit. The present invention uses a single bit line per pixel column, thus reducing power dissipation as compared to the conventional design. For example, in FIG. 2, a set of bit lines 203 representing data bits 1–16 is configured as 16 single lines.

From a system point of view, reading data from the memory cells of a display is less efficient than reading from a system memory external to the display because reading from the display typically has higher power dissipation and lower speed. However, reading data from the memory cells of the display is useful when electrically testing the display. Nonetheless, an emphasis is placed on writing to the display rather than reading from the display. Accordingly, conventional SRAM design techniques such as pulsed word line addressing, bit line equalization and bit line sense circuitry are not required.

Figure 3:
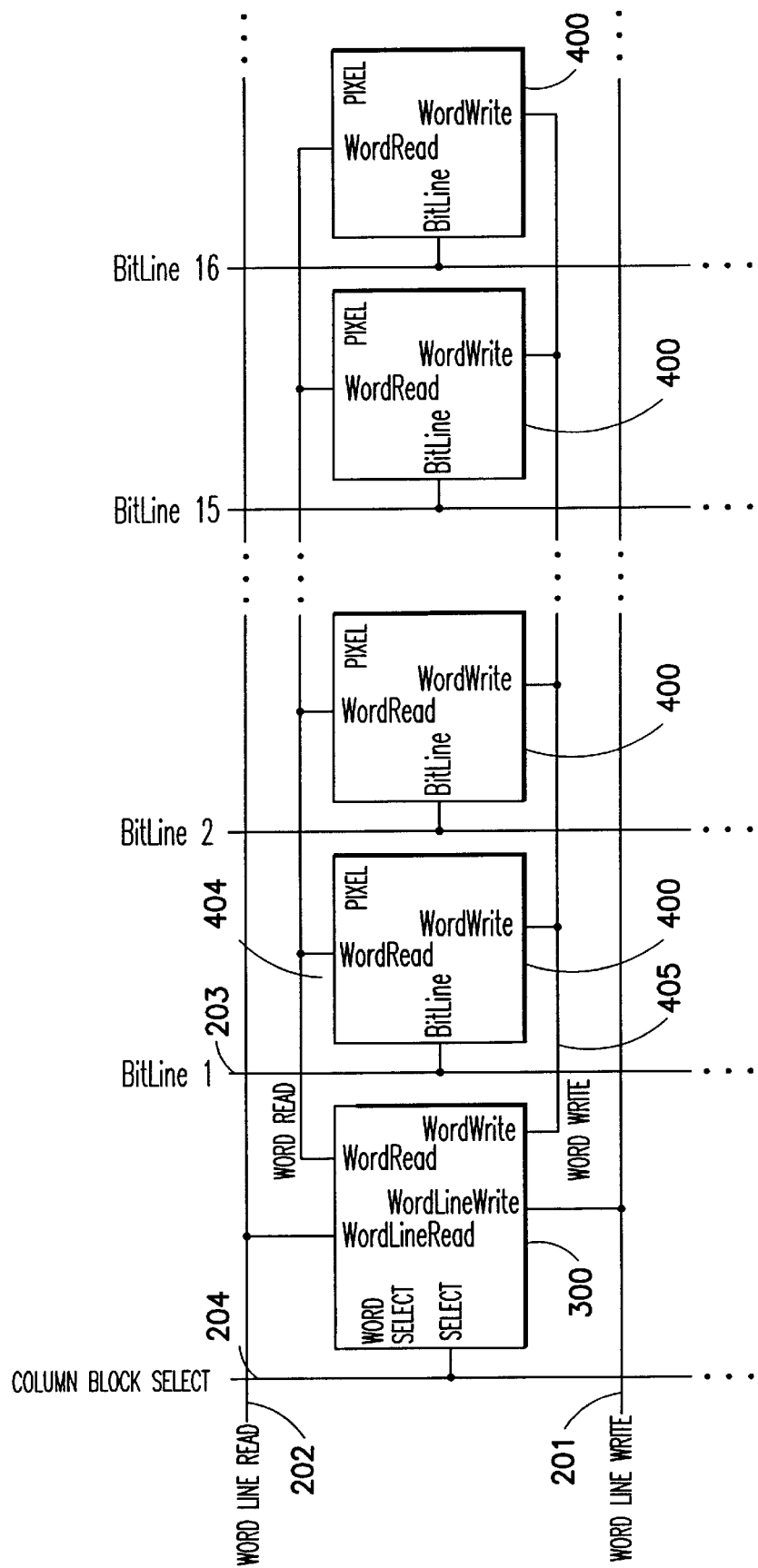
FIG. 3 is a block diagram of an embodiment of an OLED pixel word circuit.

FIG. 3 is a block diagram of an OLED pixel word structure 205. Word structure 205 includes a word select circuit 300 and sixteen pixel circuits 400. The inputs to word select circuit 300 are column block select 204, word line read 202 and word line write 201. The outputs of word select circuit 300 are word read 404 and word write 405. The inputs to pixel circuit 400 are a single bit line 203, word read 404 and word write 405. Word read 404 and word write 405 are the local word-selected extensions of word line read 202 and word line write 201, respectively. Word select circuit 300 is shown to the left of pixel circuits 400 by way of example.

Figure 4:
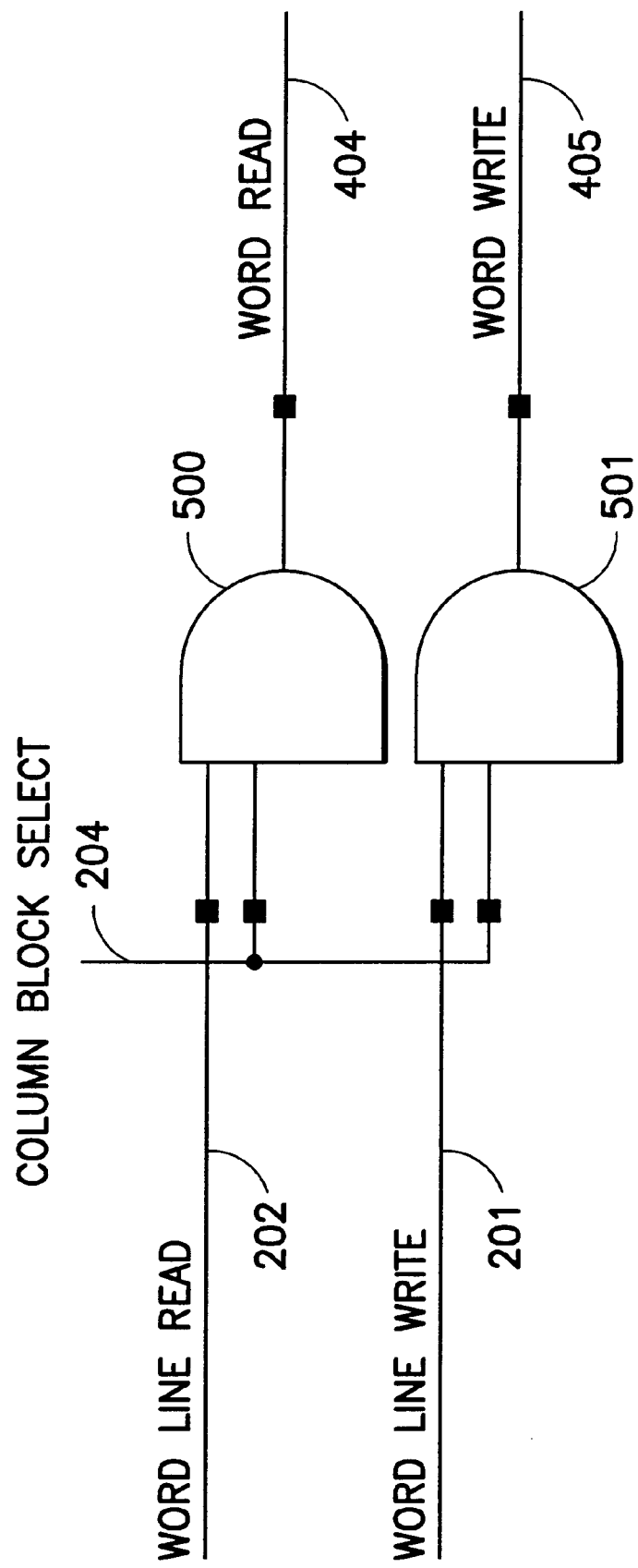
FIG. 4 is schematic of logic circuitry in a word select circuit, in accordance with these teachings.

FIG. 4 shows the circuit details of some of the logic in word select circuit 300. Word select circuit 300 includes two AND gates 500 and 501.

The inputs to AND gate 500 are column block select 204 and word line read 202. Word read 404 is the output of AND gate 500. When both column block select 204 and word line read 202 are high, i.e., active, word read 404 goes high, i.e., active.

The inputs to AND gate 501 are column block select 204 and word line write 201. Word write 405 is the output of AND gate 501. When both column block select 204 and word line write 201 are high, i.e., active, word write 405 goes high, i.e., active.

Figure 5:
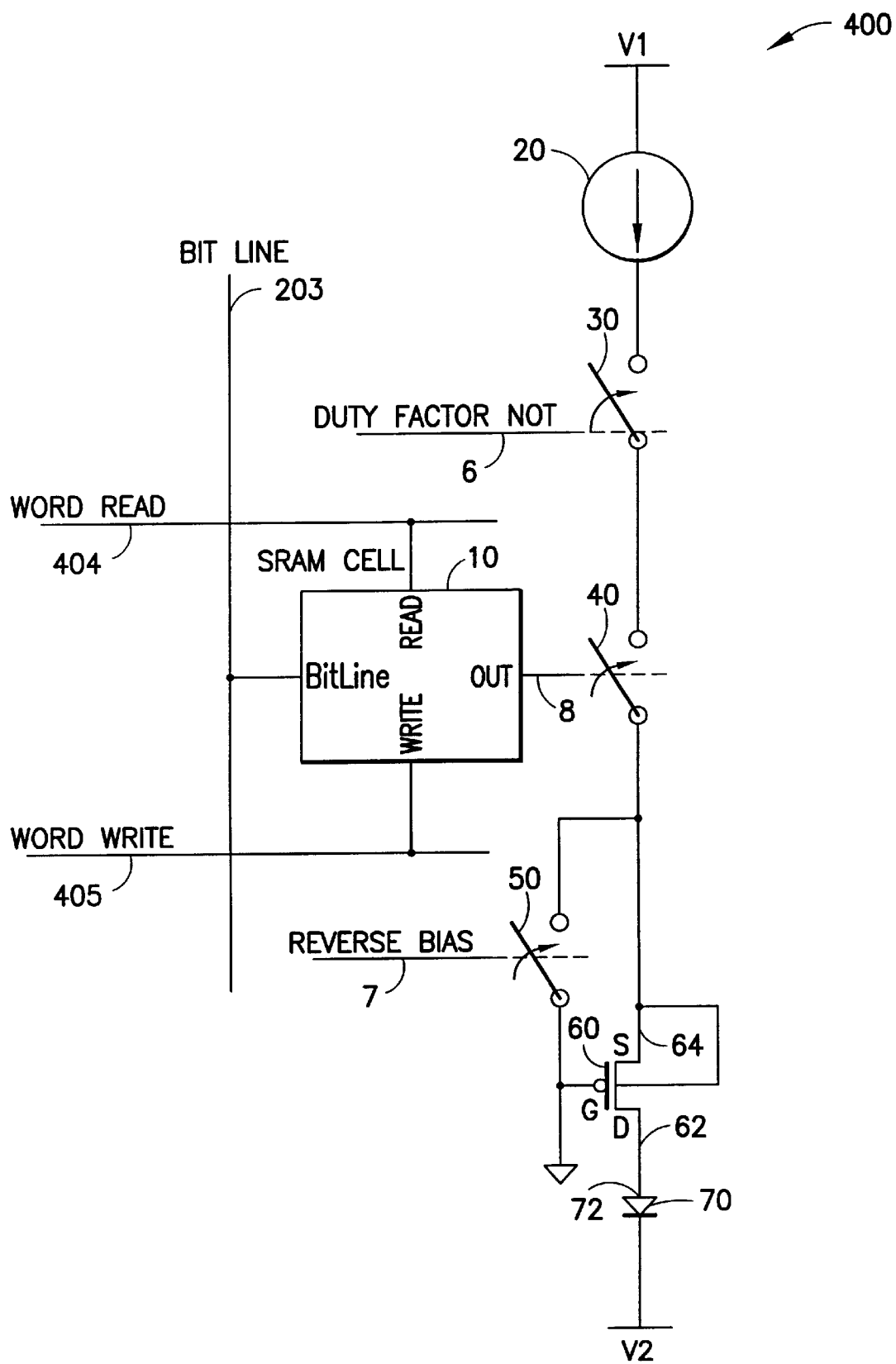
FIG. 5 is a simplified schematic of an embodiment of an OLED pixel circuit.

FIG. 5 is a simplified schematic of the major functional elements of pixel circuit 400 in array 200. Pixel circuit 400 includes an SRAM cell 10, a current source 20 connected to a voltage power supply V1, three switches 30, 40 and 50, a grounded gate p-type metal oxide semiconductor (PMOS) transistor 60 with its n-well connected to its source 64, i.e., a floating well, and an OLED 70 connected to a power supply voltage V2. During normal operation V1 is a positive voltage and V2 is a negative voltage.

The inputs to SRAM cell 10 are a single bit line 203, word read 404, and word write 405. Note that bit line 203 is a single bit line for inputting a signal that represents data to, and outputting a signal that represents the data from, SRAM cell 10. Word write 405 enables writing of data into SRAM cell 10 and word read 404 enables reading of data from SRAM cell 10. The outputs of SRAM cell 10 are bit line 203, and a control line 8. Note that bit line 203 is both an input and an output of SRAM cell 10. Control line 8 is for controlling switch 40. With high states on both bit line 203 and word write 405, a high state is written into SRAM cell 10. When SRAM cell 10 stores a high state, control line 8 closes switch 40. When SRAM cell 10 stores a low state, control line 8 opens switch 40.

V1 provides power for current source 20. Current source 20 produces an output current corresponding to a predetermined maximum brightness level of OLED 70.

It is desirable to control the luminance of OLED 70 by controlling the average current through OLED 70. A duty factor NOT 6 is a pulse width modulated signal that is provided as an input common to all pixels in array 200. A low state on duty factor NOT 6 closes switch 30. A high state on the duty factor NOT 6 opens switch 30. The duty factor NOT 6 controls the average current through OLED 70 to set its luminance to a level of less than the maximum brightness.

A reverse bias 7 is a signal that is provided as an input common to all pixels in array 200. A high state on reverse bias 7 closes switch 50. A low state on reverse bias 7 opens switch 50.

When switches 30 and 40 are closed and switch 50 is open, current flows from current source 20, through switches 30 and 40, and into source 64 of PMOS transistor 60. PMOS transistor 60 operates as a cascode stage to provide a greater voltage compliance range for current source 20, as is known in the art. Current out the drain 62 of PMOS transistor 60 flows into OLED 70 turning OLED 70 ON. Voltage compliance range is the range of output voltages over which the output current is essentially constant. A cascode stage is a common gate amplifier stage that improves the voltage compliance range by providing voltage gain.

When current is flowing through PMOS transistor 60, it has a relatively low voltage, e.g., approximately 10 millivolts, across its drain 62 and source 64. With current flowing, the voltage on drain 62 can be several volts above or below ground while the voltage on source 64 is at a minimum of one threshold voltage above ground and always higher than the voltage on its drain 62. A threshold voltage is the minimum source to gate voltage required to maintain the transistor in the normal conducting region of operation. When no current is flowing into source 64 of PMOS transistor 60, the voltage on source 64 does not go below ground.

During operation of an OLED, charge can be trapped in its organic layers. This increases the forward bias voltage of the OLED required for a given current to flow. The trapped charge can be removed by reverse-biasing the OLED, either periodically or at irregular intervals.

OLED 70 is reverse-biased by opening switch 30, thus interrupting flow of current from current source 20, closing switch 50 and switching V2 from a negative voltage to a positive voltage. Closing switch 50 grounds the source 64 and n-well of PMOS transistor 60. The drain 62 of PMOS transistor 60 is a p-diffusion. When V2 is switched to a positive voltage, current flows from V2, through OLED 70 PMOS transistor 60 and switch 50. Through PMOS transistor 60 and closed switch 50, the anode 72 of OLED 70 is held at one diode voltage drop above ground. The reverse-bias voltage across OLED 70 is the positive voltage of V2 minus one diode drop.

Reverse biasing of an OLED does not need to be performed at frequent intervals. Instead, it can be performed at irregular intervals or when a display is not being viewed. For example, in a wristwatch display, the OLED may be driven during the day in a normal forward bias manner, and at night, when the image on the display is OFF, the OLED voltage can be reverse-biased. As another example, the OLED can be reverse-biased during a pulse width modulation brightness control cycle when the OLED is turned OFF.

Figure 6:
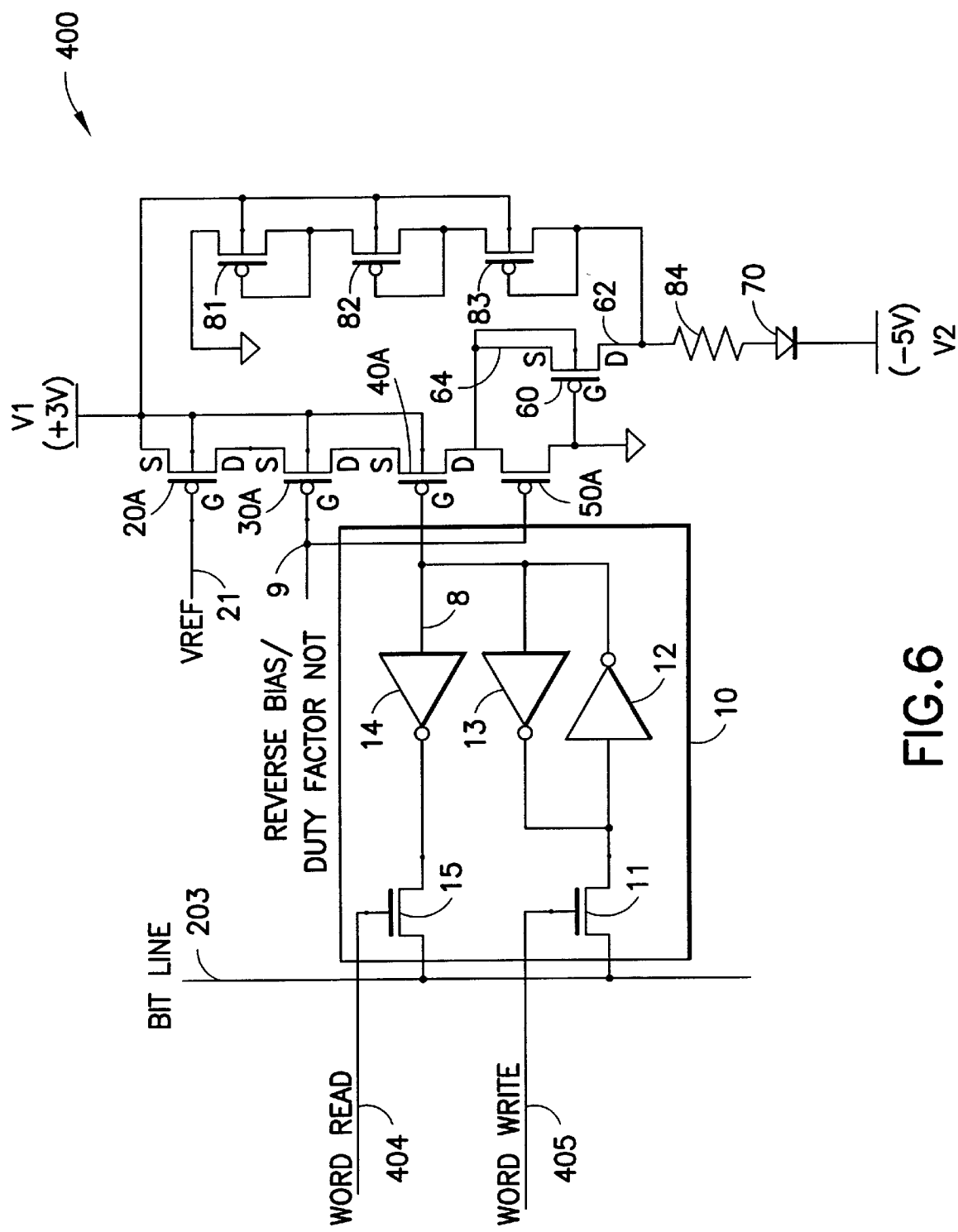
FIG. 6 is a more detailed schematic of an OLED pixel circuit.

FIG. 6 shows details of the pixel circuit 400 of FIG. 5. In this embodiment, V1 is set to +3V and V2 is set to −5V.

SRAM cell 10 includes n-type metal oxide semiconductor (NMOS) transistors 11 and 15, and inverters 12, 13 and 14. For the write operation, a high state on word write input 405 causes NMOS transistor 11 to couple the logic state on bit line 203 to the input of inverter 12.

The output of inverter 12 is an inverse of its input. The output of inverter 12 is connected to the input of inverter 13, and the input of inverter 14, and it also provides the signal for control line 8.

Inverter 13 has its output connected to the input of inverter 12. Note that inverter 12 receives its input either from bit line 203 by a turned ON NMOS transistor 11, or from the output of inverter 13. The current drive of NMOS transistor 11 is determined, in part, by a ratio of its channel width to its channel length. The current drives of inverter 12 and NMOS transistor 11 are relatively stronger, e.g., about 10 times stronger, than the drive of inverter 13. Accordingly, the input from bit line 203, by way of a turned ON NMOS transistor 11 to inverter 12, determines the state of SRAM cell 10. A data level through NMOS transistor 11 initially sets the state of inverter 12, and inverter 13 feeds back, i.e., provides a latch signal, into inverter 12 to hold the state after the data level from NMOS transistor 11 is removed. Thus, NMOS transistor 11, and inverters 12 and 13 comprise a data latch.

A PMOS transistor 40A serves the role of switch 40 (FIG. 5). Control line 8, from the output of inverter 12, is connected to the gate of PMOS transistor 40A.

To read data from SRAM cell 10, word read 404 is set high to cause NMOS transistor 15 to couple the output of inverter 14 to bit line 203. Through the inversions of inverter 12 and inverter 14, the polarity of data read out of SRAM cell 10 is the same as that previously written into SRAM cell 10.

SRAM cell 10 may be simplified by eliminating inverter 14 and connecting the output of inverter 12 directly to NMOS transistor 15. In such a case, the data read out of SRAM cell 10 is an inverse of that which was previously written into SRAM cell 10, but it can be re-inverted in a bit line read circuit (not shown). Preferably, inverter 14 is included because it isolates pixel circuit 400 from noise on bit line 203 and from capacitance loading by bit line 203 during the read operation.

A PMOS transistor 20A serves as a current source 20 (FIG. 5). A VREF 21 is connected to the gate of PMOS transistor 20A, and also to a similarly situated PMOS transistor in all of the other pixel circuits of array 200.

The previously mentioned light-blocking layer may, for instance, be used to distribute the +3V power of V1. The light-blocking layer, a conducting layer, is distributed and connected throughout the array providing a low-resistance path for V1 power distribution. In this manner, the light-blocking layer performs two functions, i.e., light-blocking and power distribution.

PMOS transistor 20A is a field effect transistor (FET) with a channel width (W), a channel length (L) and a gate to source voltage ($V_{gs}$) that are optimized within area constraints (~W×L) to minimize effects of threshold voltage ($V_T$) and channel width variations on the uniformity of current through OLED 70 of the pixels throughout the array. The channel length is determined by the seperation of drain and source diffusions as formed by the gate conductor. The channel width is the drain or source dimension along the gate conductor. In saturation $$(|V_{ds}|>|V_{gs}-V_T|),$$

the drain current is proportional to $$(W/L)\,(V_{gs}-V_T)^2,$$

where $V_{ds}$, is the drain to source voltage. VREF 21 voltage is set relative to V1 and is adjusted to obtain a desired measured maximum brightness of OLED 70, thereby removing the effect of current source transistor parameters and OLED efficiency on the overall maximum brightness of the display.

In an exemplary implementation of PMOS transistor 20A, the channel length is 79.12 microns, the channel width is 2.64 microns, and the gate to source voltage of PMOS transistor 20A is nominally −1.1 V. With a threshold voltage of −0.6 V, PMOS transistor 20A remains in saturation, i.e., produces constant current, as long as its source to drain voltage is greater than 0.5V. Note that the static source to gate voltage of PMOS transistor 20A is greater than its threshold voltage. In other words, only 0.5V of overhead voltage is required to drive OLED 70. In this regard, the design is very power efficient. With this implementation, the variation of current from PMOS transistor 20A, in pixels across the display, is less than 1.05:1.

A PMOS transistor 30A serves the role of switch 30 (FIG. 5), and an NMOS transistor 50A serves the role of switch 50 (FIG. 5). This configuration of components allows the duty factor NOT 6 and reverse bias 7 as shown in FIG. 5 to be combined in a single reverse bias/duty factor NOT 9 signal. Reverse bias/duty factor NOT 9 is an input common to all pixels in array 200.

In normal forward biased operation of OLED 70, reverse bias/duty factor NOT 9 is duty factor modulated to turn PMOS transistor 30A ON and OFF rapidly, to duty factor modulate the current in OLED 70. This digital control of the brightness of OLED 70 is more uniform than controlling it by means of an analog voltage. NMOS transistor 50A is turned ON by reverse bias/duty factor NOT 9 when PMOS transistor 30A is turned OFF to help linearize the pulse width modulation by discharging parasitic capacitances of transistors 20A, 30A, 40A, 50A and 60. If not discharged, the parasitic wiring, drain to substrate, source to substrate and FET interelectrode capacitances will allow current to continue to flow into the OLED for a short period while PMOS transistor 30A is OFF. The parasitic capacitances would tend to keep the voltage of PMOS transistor 60 source 64 high, allowing PMOS transistor 60 to continue conducting until source 64 is discharged.

CMOS circuitry is susceptible to damage if it is exposed to a voltage exceeding its breakdown voltage, which is typically 3.6V. Also, the lifespan of the organic layers is significantly shortened when subjected to temperatures greater than 100 degrees centigrade. If an OLED is shorted between its anode and cathode, then an excessive current may flow through the shorted OLED's pixel circuit. Such a current may generate heat and damage an adjacent pixel, and it may also interfere with the voltages supplied to other pixels in the display.

Accordingly, pixel circuit 400 includes a protection circuit comprising PMOS transistors 81, 82 and 83, and a resistor 84. During normal operation, when the pixel is in the OFF state, the voltage drop across OLED 70 is reduced so the voltage at drain 62 of PMOS transistor 60 becomes more negative. Each of PMOS transistors 81, 82 and 83 drops approximately 1V, so that the voltage at source 64 of PMOS transistor 60 is limited to about 3 volts more negative than ground. That is, PMOS transistors 81, 82 and 83 provide a negative (−3V) voltage clamp to assure that the gate to drain voltage of PMOS transistor 60 does not exceed its breakdown voltage rating of 3.6V. By limiting the voltage at drain 62 of PMOS transistor 60, the protection circuit effectively limits the current that can flow through the other components of pixel circuit 400. When OLED 70 is ON, the voltage at drain 62 is about 1.75V above ground. PMOS transistors 81, 82 and 83 have no effect when OLED 70 is ON.

In the case where OLED 70 is shorted, resistor 84 limits the current that can flow, and the power that can be dissipated. PMOS transistors 81, 82 and 83 still clamp the voltage at drain 62 of PMOS transistor 60 to approximately −3 volts, and any excess voltage is dropped across resistor 84. In a preferred embodiment, resistor 84 is manufactured of undoped polysilicon having 40,000 ohms of resistance.

PMOS transistors 81, 82 and 83, and resistor 84 also allow testing of OLED 70, and through similarly situated components in other pixel circuits, all of the OLED pixels in array 200. This done by setting V2 to a negative voltage, e.g., −7V, with respect to ground, and either allowing V1 to float or setting it to ground. With this arrangement, current path is created from ground through PMOS transistors 81, 82 and 83, resistor 84, OLED 70 to V2. Each of PMOS transistors 81, 82 and 83 drop about 0.7V. OLED 70 is forward biased, and if it is good, then it turns ON. This test is useful, for example, to spot defects after OLED deposition and sealing prior to further assembly of the display.

In addition to the techniques for saving power mentioned above, power can be saved by managing the manner in which images are written to a display. For example, display power dissipation is proportional to the brightness of a pixel, and the number of pixels that are ON, therefore a strategy to reduce the brightness of a pixel and the number pixels that are ON would result in a saving of power.

For example, if array 200 is installed in a display for a wristwatch, then the number of pixels required to show the time as hands of a clock is between 1 and 2% of the total number of pixels. A typical screen for text might turn ON 10 to 20% of the pixels. Images may require an illumination of 50% of the pixels.

Accordingly, gray scale images are produced by spatial dithering as opposed to frame sequential operation to eliminate the power required to write rapidly to the display, as would be required for frame sequential operation.

The number of ON pixels is usually less than 50%, and therefore power can be saved by clearing the display in one operation before writing new data to the display and by only writing to word structures that have pixels turned ON. The full display can be cleared using bit line and word line driver circuits outside the array. If all word line writes 201 and column block selects 204 are brought high, with low data states on all bit lines 203, then low level data is written into all SRAM cells 10 in array 200 turning OFF all the pixels in the display. In the example of a wristwatch, the control for this function is issued by the watch processor prior to updating the display. Then, data is written only to pixels that need to be ON in the new displayed screen.

Since a watch display typically displays time 99% of the time and since the watch hands that indicate the time do not require high contrast, the brightness when showing time can be reduced to a relatively low luminance level, e.g., about 30 candelas/meter squared. This luminance level should be sufficient for nighttime use and for low contrast applications at room ambient light levels. For showing text and images in room ambient conditions, 100 candelas/meter squared should be sufficient. Only use in bright sunlight conditions require luminance levels of 500 candelas/meter squared.

To save power during a watch system standby function, the reverse bias/Duty factor NOT 9 should be in a high state. In addition, the connection of V2 to the display should be opened to eliminate any OFF state OLED current or currents due to OLED shorts. Accordingly, the current path between V1 and V2 is broken so that no current flows through pixel circuit 400.

Also, the standby current draw of SRAM cell 10 can be reduced if the voltage of V1 is reduced, but not set so low that the display losses its data. Lowering the supply voltage reduces the leakage current through inverters 12, 13 and 14, and thus lowers standby power. In the wristwatch application, the control for standby is provided by the watch processor.

The control signals for duty factor NOT 6, reverse bias 7, standby and clear can be written into an a SRAM word structure that forms a display control register, as described below, that is not part of array 200, but external to it. In this manner, the display control signals are part of the display and not located elsewhere in the watch, thus reducing the number of dedicated signal lines to the display.

One function of the control register is to "clear" the display, i.e., turn all pixels OFF in one operation. That is, to clear the displayed image without addressing all of the individual pixels of the display. This is done so that the processor need write only the pixels that will be ON in the new image, thus reducing power dissipation and burden on the processor compared to writing all pixels of the display.

Figure 7:
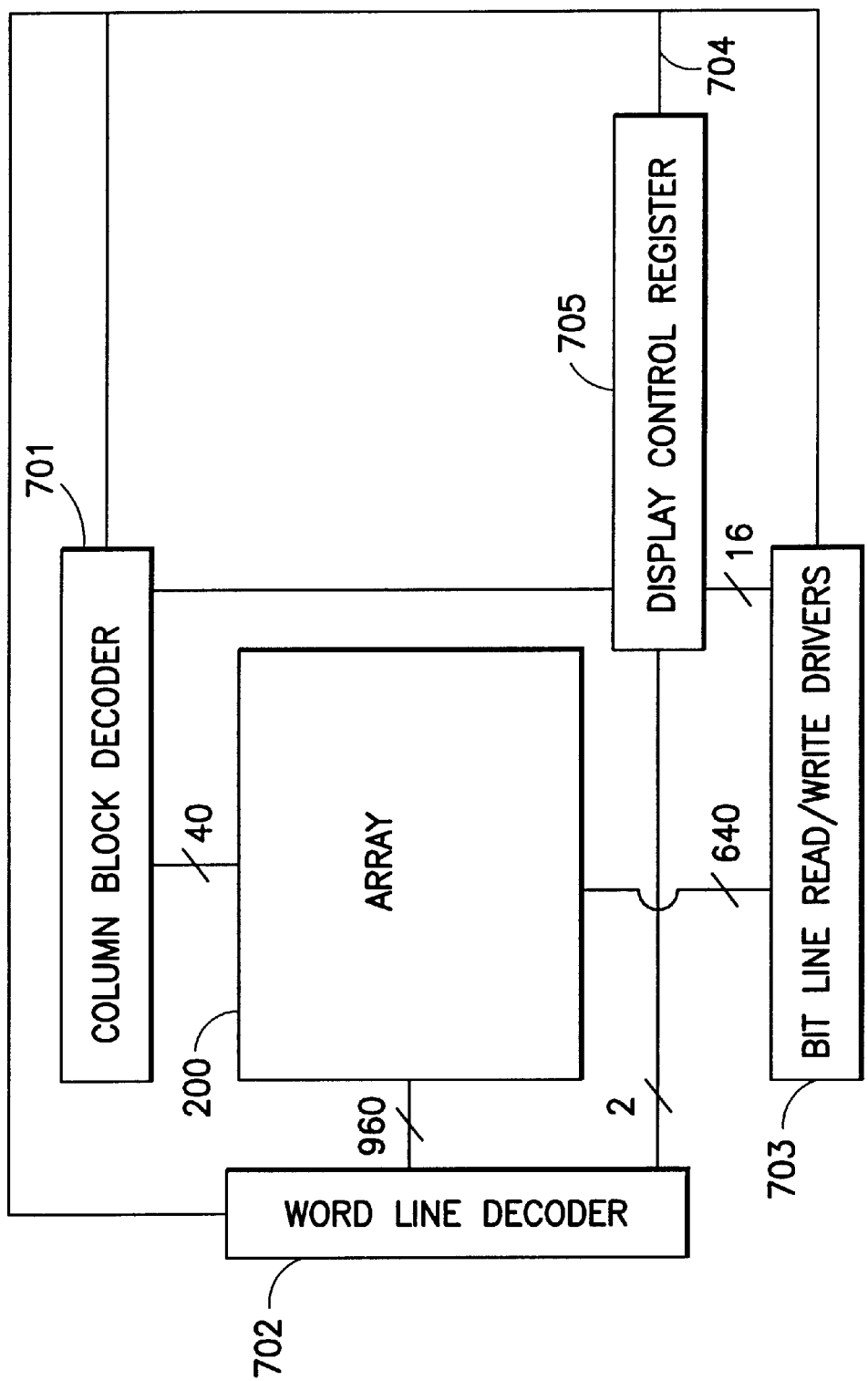
FIG. 7 is a block diagram of display and control register clear connections for driving an OLED array.

FIG. 7 shows the functional blocks of the display involved in writing to and reading from array 200 and a display control register 705, and the control flow for the clear operation. The processor (not shown) writes a word into display control register 705 including one bit that is dedicated to the clear function. In the exemplary embodiment shown in FIG. 7, a word has 16 bits.

In operation, the processor sends addresses, a read/write signal, a chip select signal, and image data to the display. For each address and data word received, one column select line 204 (FIG. 2) is activated by a column block decoder 701, one word line read 202 (FIG. 2) or one word line write 201

(FIG. 2) is activated by a word line decoder 702, and appropriate bit lines 203 (FIG. 2) are selected by bit line read/write drivers 703. If a clear operation is to be performed, display control register 705 is addressed for writing by the column block decoder 701 and word line decoder 702, and the data bit for clear is applied to the bit line read/write drivers 703 and stored in display control register 705. A clear line output 704 of display control register 705 is then activated, applying a clear signal to column block decoder 701, word line decoder 702 and bit line read/write drivers 703, which causes a "zero" to be written to all pixels of array 200 simultaneously, turning OFF all OLEDs.

The display is designed to be addressed by the memory expansion bus of a microprocessor which transmits image data to the display in the form of words, each comprising the data for several pixels at a time, for example, 16 pixels at a time. Data may also be read out of the SRAM storage of the display, for instance for testing purposes, also a word at a time. To facilitate this, word select circuits are embedded in the display, for example, one such circuit for every horizontal group of 16 pixels. This necessitates a periodic shifting of the connections between the pixel circuits and the actual pixels to maintain a uniform, or constant, pixel pitch.

Figure 8:
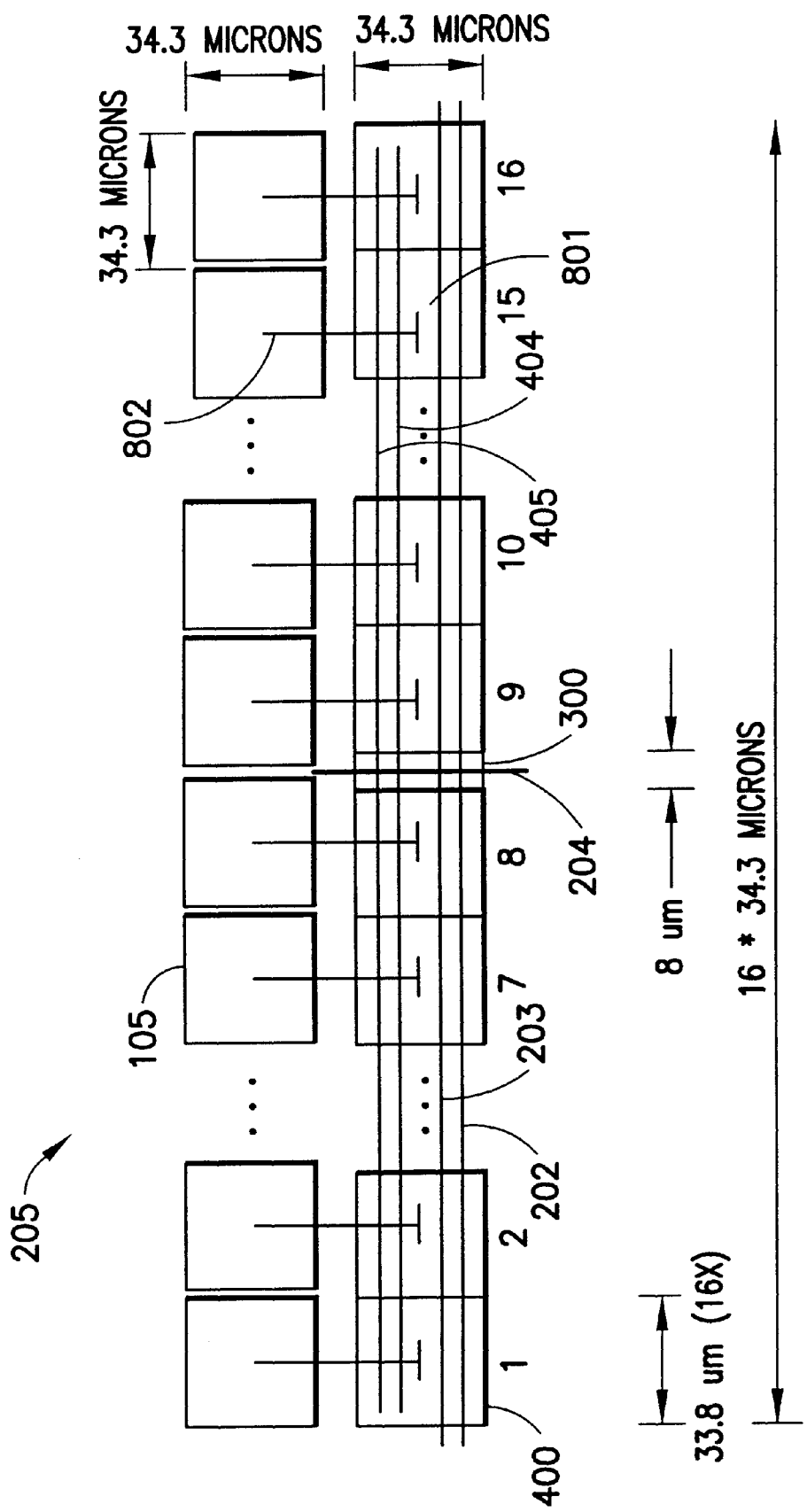
FIG. 8 is a block diagram of an OLED pixel word structure showing a physical relationship of pixel circuits and a word select circuit to respective anodes of OLED pixels.

FIG. 8 is a block diagram of an OLED pixel word structure 205 showing a physical relationship of pixel circuits 400 and a word select circuit 300 to respective anodes of OLED pixels. Word structure 205 is comprised of 16 pixel circuits 400 and one word select circuit 300 disposed along a row of array 200. 16 OLED anode electrodes 105 overlay word structure 205, each anode being connected by a conductive via 802 to a metal conductor 801 of a corresponding pixel circuit 400. Via 802 and conductor 801 are part of a conductive path from pixel circuit 400 to anode 105, i.e. a connection from resistor 84 to OLED 70 in FIG. 6. Although in FIG. 8 anode electrodes 105 and pixel circuits 400 are shown adjacent to each other for clarity, it will be clear that in practice they overlap each other, at least in part. In the example of FIG. 8, the average row-wise dimension of pixel circuit 400 and the pitch of anode electrode 105 are 34.3 microns, while the row-wise pitch of word select circuit 300 is 8 microns. In order for the 16 pixel circuits 400 and one word select circuit 300 to occupy the same horizontal space as the 16 anode electrodes 105, the row-wise dimension of each pixel circuit 400 is reduced by 0.5 microns, i.e., from 34.3 microns to 33.8 microns, as compared to the anode electrodes 105. Preferably, via 802 should be centered on each anode electrode 105, or at least be located at the same relative position on each anode electrode 105. To achieve this, conductor 801 of each pixel circuit 400 has a sufficient row-wise extent to accommodate the shifting position of via 802. The result is that the pitch of the OLED anodes is uniform throughout the array even though the pitch of the pixel circuits, to which the OLED anodes are connected, is not uniform.

In summary, the pixel circuits of the present invention offer many advantages over the prior art. For example, CMOS circuits are incorporated into each pixel of an active matrix OLED display. The circuits exhibit low power dissipation for battery operation, incorporate a constant current source for uniformity of brightness and reduced dependence of brightness on the characteristics of the OLED, and permit the use of a lower voltage circuit technology than the voltage which the OLED requires for operation. Each pixel incorporates an SRAM memory cell to control the state, ON or OFF, of the pixel and so does not require periodic refreshing. The circuit also has a provision for application of reverse voltage when required to minimize deterioration of the OLED over time, a provision for duty factor control of luminance, and a current limiting resistor to isolate the effect of shorted pixels. The display is addressed by the memory expansion bus of a microprocessor in the form of words of several pixels length, and the display data may be read out in the same form. Circuits for decoding the word address are embedded in the array of pixels that comprise the display. Furthermore, a provision is made to clear the display image in one operation so that a new image may be displayed by addressing only the pixels that are turned ON.

While the invention has been particularly shown and described with respect to preferred embodiments thereof, it will be understood by those skilled in the art that changes in form and details may be made therein without departing from the invention. Accordingly, the present invention is intended to embrace all such alternatives, modifications and variances that fall within the scope of the appended claims.

What is claimed is:

1. A pixel circuit comprising:
   a static memory for storing data that represents an operational state of a pixel;
   a first input to enable writing data into said static memory;
   a second input to enable reading data from said static memory; and
   wherein said static memory comprises:
   a first component through which a data signal is coupled to provide a source signal drive current;
   a second component having an input for receiving said source signal drive current from said first component, and for being driven to a state to produce at an output thereof an output drive current that represents said stored data; and
   a third component having an input coupled to said output of said second component, and an output coupled to said input of said second component, for providing a latch signal drive current, which is less than said source signal drive current and said output drive current of said second component, to thereby maintain said state of said second component after a removal of said source signal.

2. The pixel circuit of claim 1, further comprising a single bit line for inputting a signal that represents said data to, and outputting a signal that represents said data from, said static memory.

3. The pixel circuit of claim 2, wherein said static memory further comprises a fourth component that couples said output of said second component that represents said stored data to said single bit line.

4. The pixel circuit of claim 1,
   wherein said pixel circuit comprises a material disposed on a substrate,
   wherein said material is selected from the group consisting of crystalline silicon, amorphous silicon, polysilicon, micro crystalline silicon, an organic material and a polymer material, and
   wherein said substrate is selected from the group consisting of silicon, glass, plastic, ceramic and sapphire ($AL_2O_3$).

5. The pixel circuit of claim 1, wherein said pixel comprises an organic light emitting diode (OLED).

6. A display comprising an array of pixel circuits, wherein each of said pixel circuits comprises:
   a light emitting device;
   a static memory for storing data that represents an operational state of said light emitting device;

a first control input for enabling the writing of data to said static memory;

a second control input for enabling the reading of data from said static memory, wherein said data represents a luminous state of said light emitting device; and wherein said static memory comprises:
- a first component through which a data signal is coupled to provide a source signal drive current;
- a second component having an input for receiving said source signal drive current from said first component, and for being driven to a state to produce at an output thereof an output drive current that represents said stored data; and
- a third component having an input coupled to said output of said second component, and an output coupled to said input of said second component, for providing a latch signal drive current, which is less than said source signal drive current and said output drive current of said second component, to thereby maintain said state of said second component after a removal of said source signal.

7. The display of claim 6, wherein each of said pixel circuits is addressed by a processor via a memory bus.

8. The display of claim 6, wherein said array is a component of an electronic watch.

9. The display of claim 6, wherein said light emitting device comprises an organic light emitting diode.

10. The display of claim 9, wherein each said OLED comprises an electrode, wherein said OLEDs are separated from one another by a pitch that is uniform throughout said array, and wherein said pixel circuits are separated from one another by a pitch that is not uniform throughout said array.

11. The display of claim 9, further comprising a circuit for simultaneously setting all of said OLEDs to a uniform operation at state.

12. The display of claim 11, wherein said uniform operational state of said OLEDs is OFF, and wherein said display is controlled by a processor that subsequently sets selected individuals of said OLEDs ON.

13. The display of claim 11, wherein said circuit is addressed by a processor via a memory bus.

14. The display of claim 6, further comprising a single bit line for inputting a signal that represents said data to, and outputting a signal that represents said data, from said static memory.

15. The display of claim 14, wherein said static memory further comprises a fourth component that couples said output of said second component that represents said stored data to said single bit line.

16. A static memory cell circuit comprising:
- a semiconductor memory cell;
- a first control input for writing data into said memory cell;
- a second control input for reading data from said memory cell; and wherein said memory cell comprises:
- a first component through which a data signal is coupled to provide a source signal drive current;
- a second component having an input for receiving said source signal drive current from said first component, and for being driven to a state to produce at an output thereof an output drive current that represents said written data; and
- a third component having an input coupled to said output of said second component, and an output coupled to said input of said second component, for providing a latch signal drive current, which is less than said source signal drive current and said output drive current of said second component, to thereby maintain said state of said second component after a removal of said source signal.

17. The static memory cell circuit of claim 16, further comprising:
a single bit line for writing and reading data to and from said memory cell.

18. The static memory cell circuit of claim 16, further comprising a single bit line for inputting a signal that represents said data to, and outputting a signal that represents said data, from said memory cell.

19. The static memory cell circuit of claim 18, wherein said memory cell further comprises a fourth component that couples said output of said second component that represents said stored data to said single bit line.

20. A static memory comprising:
- an array of semiconductor circuits, each semiconductor circuit being capable of storing a bit of data;
- a first control input connected to each of said semiconductor circuits for writing data;
- a second control input connected to each of said semiconductor circuits for reading data; and wherein each of said semiconductor circuits comprises:
- a first component through which a data signal is coupled to provide a source signal drive current;
- a second component having an input for receiving said source signal drive current from said first component, and for being driven to a state to produce at an output thereof an output drive current that represents said stored data; and
- a third component having an input coupled to said output of said second component, and an output coupled to said input of said second component, for providing a latch signal drive current, which is less than said source signal drive current and said output drive current of said second component, to thereby maintain said state of said second component after a removal of said source signal.

21. The static memory of claim 20, further comprising separate single bit lines connected to separate ones of said semiconductor circuits.

22. The static memory of claim 21, further comprising a second array of semiconductor circuits with said separate bit lines also being connected to separate ones of the semiconductor circuits of said second array.

23. The static memory of claim 22, further comprising:
- a third control input connected to each of the semiconductor circuits of said second array for writing data; and
- a fourth control input connected to each of the semiconductor circuit of said second array for reading data.

24. The static memory of claim 20, wherein each of said semiconductor circuits further comprises a light emitting device and said data represents a luminance state thereof.

25. The static memory of claim 20, further comprising a single bit line for inputting a signal that represents said data to, and outputting a signal that represents said data, from one or more of said semiconductor circuits.

26. The static memory of claim 25, wherein each of said semiconductor circuits further comprises a fourth component that couples said output of said second component that represents said stored data to said single bit line.

* * * * *